United States Patent
Zheng et al.

(10) Patent No.: US 9,768,585 B2
(45) Date of Patent: Sep. 19, 2017

(54) TUNABLE LASER INCLUDING PARALLEL LASING CAVITIES WITH A COMMON OUTPUT

(71) Applicant: Applied Optoelectronics, Inc., Sugar Land, TX (US)

(72) Inventors: Jun Zheng, Missouri City, TX (US); Stefan Murry, Houston, TX (US); Klaus Alexander Anselm, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 14/661,772

(22) Filed: Mar. 18, 2015

(65) Prior Publication Data

US 2016/0277117 A1   Sep. 22, 2016

(51) Int. Cl.
| | |
|---|---|
| *H01S 5/06* | (2006.01) |
| *H01S 3/10* | (2006.01) |
| *H01S 3/08* | (2006.01) |
| *H01S 5/0625* | (2006.01) |
| *H01S 5/0687* | (2006.01) |
| *H01S 5/028* | (2006.01) |
| *H01S 5/024* | (2006.01) |
| *H01S 5/40* | (2006.01) |
| *H01S 5/12* | (2006.01) |

(52) U.S. Cl.
CPC ........ *H01S 5/06256* (2013.01); *H01S 5/0687* (2013.01); *H01S 5/06258* (2013.01); *H01S 5/4087* (2013.01); *H01S 5/0287* (2013.01); *H01S 5/02415* (2013.01); *H01S 5/124* (2013.01); *H01S 5/4012* (2013.01)

(58) Field of Classification Search
CPC ...... H04J 14/0279; H04J 14/02; H04B 10/503
USPC .............................................. 398/79, 69, 68
See application file for complete search history.

(56) References Cited

U.S. PATENT DOCUMENTS

| | | | |
|---|---|---|---|
| 4,461,007 A * | 7/1984 | Burnham | H01S 5/10 372/45.01 |
| 6,275,317 B1 | 8/2001 | Doerr et al. | |
| 6,608,855 B1 | 8/2003 | Hwang et al. | |

(Continued)

OTHER PUBLICATIONS

PCT International Search Report and Written Opinion mailed Jul. 12, 2016, received in corresponding PCT Application No. PCT/US16/23106, 13 pgs.

*Primary Examiner* — Oommen Jacob
(74) *Attorney, Agent, or Firm* — Grossman Tucker Perreault & Pfleger, PLLC; Norman S. Kinsella

(57) ABSTRACT

A parallel cavity tunable laser generally includes a semiconductor laser body defining a plurality of parallel laser cavities with a common output. Each of the parallel laser cavities is configured to be driven independently to generate laser light at a wavelength within a different respective wavelength range. The wavelength of the light generated in each of the laser cavities may be tuned, in response to a temperature change, to a channel wavelength within the respective wavelength range. The laser light generated in each selected one of the laser cavities is emitted from the common output at a front facet of the laser body. By selectively generating light in one or more of the laser cavities, one or more channel wavelengths may be selected for lasing and transmission.

25 Claims, 5 Drawing Sheets

(56) References Cited

U.S. PATENT DOCUMENTS

| | | | | |
|---|---|---|---|---|
| 6,638,773 | B1* | 10/2003 | Hwang | H01S 5/1082 438/2 |
| 7,236,709 | B1 | 6/2007 | Fairchild | |
| 7,382,817 | B2 | 6/2008 | He | |
| 7,633,984 | B2* | 12/2009 | Hayakawa | H01S 5/06256 372/20 |
| 2003/0081638 | A1 | 5/2003 | Hamster et al. | |
| 2003/0095737 | A1 | 5/2003 | Welch et al. | |
| 2007/0019956 | A1 | 1/2007 | Sorin et al. | |
| 2007/0165682 | A1 | 7/2007 | He et al. | |
| 2009/0092160 | A1 | 4/2009 | Hunter et al. | |
| 2010/0046945 | A1* | 2/2010 | Lee | H04J 14/0226 398/68 |
| 2011/0293279 | A1* | 12/2011 | Lam | H04J 14/0279 398/79 |
| 2014/0010250 | A1 | 1/2014 | Gao | |
| 2015/0078751 | A1* | 3/2015 | Zheng | H04B 10/503 398/79 |
| 2015/0357791 | A1* | 12/2015 | Zheng | H01S 5/06258 398/69 |

* cited by examiner

TUNABLE LASER INCLUDING PARALLEL LASING CAVITIES WITH A COMMON OUTPUT

TECHNICAL FIELD

The present invention relates to tunable lasers and more particularly, to a tunable laser including parallel lasing cavities with a common output for tuning within multiple different ranges of channel wavelengths in tunable transmitters or transceivers in a wavelength division multiplexed (WDM) passive optical network (PON).

BACKGROUND INFORMATION

Optical communications networks, at one time, were generally "point to point" type networks including a transmitter and a receiver connected by an optical fiber. Such networks are relatively easy to construct but deploy many fibers to connect multiple users. As the number of subscribers connected to the network increases and the fiber count increases rapidly, deploying and managing many fibers becomes complex and expensive.

A passive optical network (PON) addresses this problem by using a single "trunk" fiber from a transmitting end of the network, such as an optical line terminal (OLT), to a remote branching point, which may be up to 20 km or more. One challenge in developing such a PON is utilizing the capacity in the trunk fiber efficiently in order to transmit the maximum possible amount of information on the trunk fiber. Fiber optic communications networks may increase the amount of information carried on a single optical fiber by multiplexing different optical signals on different wavelengths using wavelength division multiplexing (WDM). In a WDM-PON, for example, the single trunk fiber carries optical signals at multiple channel wavelengths to and from the optical branching point and the branching point provides a simple routing function by directing signals of different wavelengths to and from individual subscribers. At each subscriber location, an optical networking terminal (ONT) or optical networking unit (ONU) is assigned one or more of the channel wavelengths for sending and/or receiving optical signals.

A challenge in a WDM-PON, however, is designing a network that will allow the same transmitter to be used in an ONT or ONU at any subscriber location. For ease of deployment and maintenance in a WDM-PON, it is desirable to have a "colorless" ONT/ONU whose wavelength can be changed or tuned such that a single device could be used in any ONT/ONU on the PON. With a "colorless" ONT/ONU, an operator only needs to have a single, universal transmitter or transceiver device that can be employed at any subscriber location.

One or more tunable lasers may be used to select different wavelengths for optical signals in a WDM system or network such as a WDM-PON. Various different types of tunable lasers have been developed over the years, but most were developed for high-capacity backbone connections to achieve high performance and at a relatively high cost. Many WDM-PON applications have lower data rates and shorter transmission distances as compared to high-capacity, long-haul WDM systems, and thus a lower performance and lower cost laser may suffice. The less expensive tunable lasers, however, often present challenges when used to cover a relatively wide range of channels (e.g., 16 channels) in a WDM-PON. In less expensive DFB lasers that are tuned by controlling the temperature, for example, the wavelength changes by only about 0.1 nm/° C. A temperature range of 120° C. would be needed to cover 16 channel wavelengths using such a laser.

A tunable laser with multiple in-line sections has been used to cover a wide range of channels, for example, as described in U.S. patent application Ser. No. 13/916,652 filed on Jun. 13, 2013, which is commonly owned and incorporated herein by reference. Although this tunable laser with multiple in-line sections is effective, the longer cavity may be difficult to modulate at higher data rates (e.g., 2.5 G or 10 G) in a WDM-PON. External modulators may be used to achieve these higher data rates, but there is a need for a tunable laser capable of being tuned to a wide range of channel wavelengths and modulated at higher data rates with or without an external modulator.

BRIEF DESCRIPTION OF THE DRAWINGS

These and other features and advantages will be better understood by reading the following detailed description, taken together with the drawings wherein.

DETAILED DESCRIPTION

Figure 1:
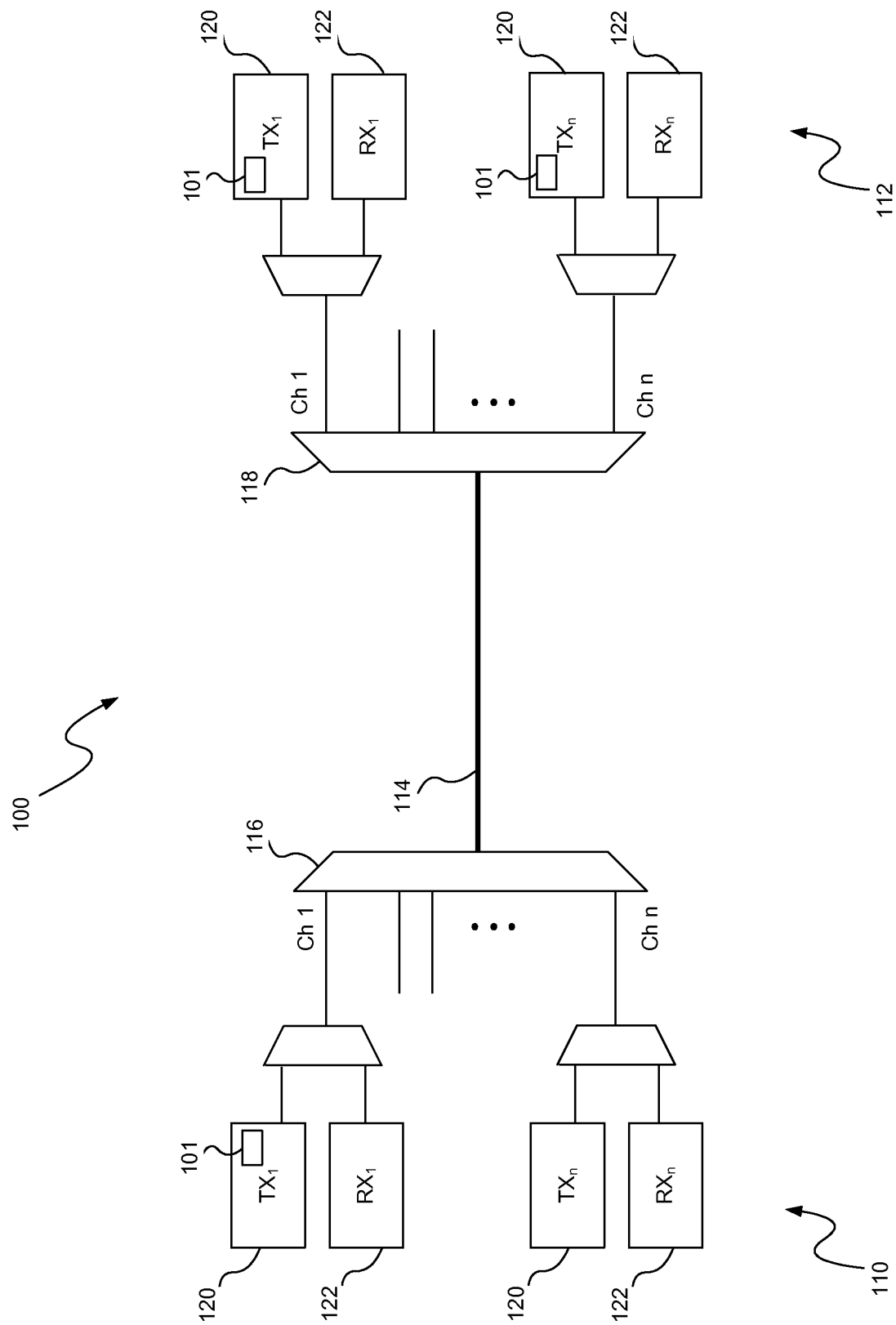
FIG. 1 is a schematic diagram of a wavelength division multiplexed (WDM) optical communication system including at least one parallel cavity tunable laser, consistent with embodiments of the present disclosure.

A parallel cavity tunable laser, consistent with embodiments described herein, generally includes a semiconductor laser body defining a plurality of parallel laser cavities with a common output. Each of the parallel laser cavities is configured to be driven independently to generate laser light at a wavelength within a different respective wavelength range. The wavelength of the light generated in each of the laser cavities may be tuned, in response to a temperature change, to a channel wavelength within the respective wavelength range. The laser light generated in each selected one of the laser cavities is emitted from the common output at a front facet of the laser body. By selectively generating light in one or more of the laser cavities, one or more channel wavelengths may be selected for lasing and transmission.

The parallel cavity tunable laser may be used, for example, in a tunable transmitter, to generate an optical signal at a selected channel wavelength and/or in a multiplexing optical transmitter to generate and combine optical signals at multiple different channel wavelengths. In one application, the parallel cavity tunable laser may be used in optical transmitters or transceivers in a wavelength division multiplexed (WDM) optical system. A parallel cavity tunable laser may be used, for example, in a tunable transmitter or transceiver in a WDM system such as an optical networking terminal (ONT) or optical networking unit (ONU) in a WDM passive optical network (PON) to select the appropriate transmission channel wavelength for the ONT/ONU. A parallel cavity tunable laser may also be used, for example, in an optical line terminal (OLT) in a WDM-PON to provide multiple optical signals at different channel wavelengths.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. As used herein, "tuning to a channel wavelength" refers to adjusting a laser output such that the emitted laser light includes the channel wavelength. As used herein, "parallel" laser cavities refers to laser cavities that extend side by side within a laser (as opposed to in series) and does not require the same distance continuously between the laser cavities or simultaneous operation of the laser cavities. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals. As used herein, "thermally coupled" refers to a direct or indirect connection or contact between two components resulting in heat being conducted from one component to the other component.

Referring to FIG. 1, a WDM optical communication system 100 including one or more parallel cavity tunable lasers 101, consistent with embodiments of the present disclosure, is shown and described. The WDM system 100 includes one or more terminals 110, 112 coupled at each end of a trunk optical fiber or path 114 for transmitting and receiving optical signals at different channel wavelengths over the trunk optical path 114. The terminals 110, 112 at each end of the WDM system 100 include one or more transmitters 120 (e.g., $T_{X1}$ to $T_{Xn}$) and receivers 122 (e.g., $R_{X1}$ to $R_{Xn}$) associated with different channels (e.g., Ch. 1 to Ch. n) for transmitting and receiving optical signals at the different channel wavelengths between the one or more terminals 110, 112.

Each terminal 110, 112 may include one or more transmitters 120 and receivers 122, and the transmitters 120 and receivers 122 may be separate or integrated as a transceiver within a terminal. Optical multiplexers/demultiplexers 116, 118 at each end of the WDM system 100 combine and separate the optical signals at the different channel wavelengths. Aggregate WDM optical signals including the combined channel wavelengths are carried on the trunk optical path 114. One or more of the transmitters 120 may be a tunable transmitter capable of being tuned to the appropriate channel wavelength using a parallel cavity tunable laser 101. Thus, the transmitters 120 may be constructed as universal, tunable transmitters capable of being used in different locations in the WDM system 100 and tuned to the appropriate channel wavelength depending upon the location in the WDM system 100.

Figure 2:
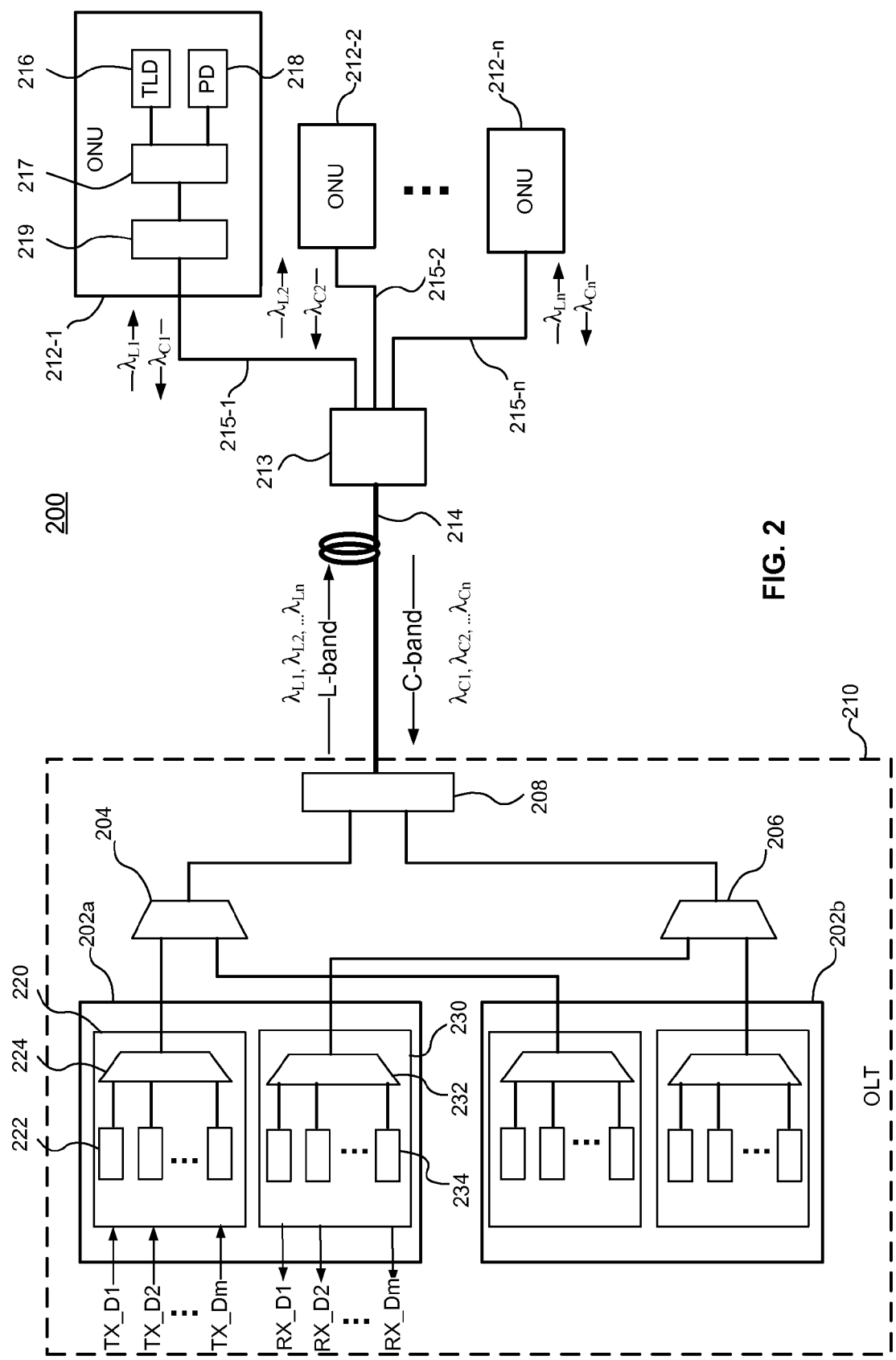
FIG. 2 is a schematic diagram of a wavelength division multiplexed (WDM) passive optical network (PON) including at least one parallel cavity tunable laser, consistent with embodiments of the present disclosure.

Referring to FIG. 2, one or more parallel cavity tunable lasers, consistent with embodiments of the present disclosure, may be used in transmitters and/or transceivers in a WDM-PON 200. The WDM-PON 200 provides a point-to-multipoint optical network architecture using a WDM system. According to one embodiment of the WDM-PON 200, at least one optical line terminal (OLT) 210 may be coupled to a plurality of optical networking terminals (ONTs) or optical networking units (ONUs) 212-1 to 212-n via optical fibers, waveguides, and/or paths 214, 215-1 to 215-n. The OLT 210 includes one or more multi-channel optical transceivers 102a, 102b. The parallel cavity tunable lasers may be used in the ONTs/ONUs and/or in the OLT 210 to allow tuning to a channel wavelength, as described in greater detail below.

The OLT 210 may be located at a central office of the WDM-PON 200, and the ONUs 212-1 to 212-n may be located in homes, businesses or other types of subscriber location or premises. A branching point 213 (e.g., a remote node) couples a trunk optical path 214 to the separate optical paths 215-1 to 215-n to the ONUs 212-1 to 212-n at the respective subscriber locations. The branching point 213 may include one or more passive coupling devices such as a splitter or optical multiplexer/demultiplexer. In one example, the ONUs 212-1 to 212-n may be located about 20 km or less from the OLT 210.

The WDM-PON 200 may also include additional nodes or network devices, such as Ethernet PON (EPON) or Gigabit PON (GPON) nodes or devices, coupled between the branching point 213 and ONUs 212-1 to 212-n at different locations or premises. One application of the WDM-PON 200 is to provide fiber-to-the-home (FTTH) or fiber-to-the-premises (FTTP) capable of delivering voice, data, and/or video services across a common platform. In this application, the central office may be coupled to one or more sources or networks providing the voice, data and/or video.

In the WDM-PON 200, different ONUs 212-1 to 212-n may be assigned different channel wavelengths for transmitting and receiving optical signals. In one embodiment, the WDM-PON 200 may use different wavelength bands for transmission of downstream and upstream optical signals relative to the OLT 210 to avoid interference between the received signal and back reflected transmission signal on the same fiber. For example, the L-band (e.g., about 1565 to 1625 nm) may be used for downstream transmissions from the OLT 210 and the C-band (e.g., about 1530 to 1565 nm) may be used for upstream transmissions to the OLT 210. The upstream and/or downstream channel wavelengths may generally correspond to the ITU grid. In one example, the upstream wavelengths may be aligned with the 100 GHz ITU grid and the downstream wavelengths may be slightly offset from the 100 GHz ITU grid.

The ONUs 212-1 to 212-n may thus be assigned different channel wavelengths within the L-band and within the C-band. Transceivers or receivers located within the ONUs 212-1 to 212-n may be configured to receive an optical signal on at least one channel wavelength in the L-band (e.g., $\lambda_{L1}, \lambda_{L2}, \ldots \lambda_{Ln}$). Transceivers or transmitters located within the ONUs 212-1 to 212-n may be configured to transmit an optical signal on at least one channel wavelength in the C-band ($\lambda_{C1}, \lambda_{C2}, \ldots \lambda_{Cn}$). Other wavelengths and wavelength bands are also within the scope of the system and method described herein.

The branching point 213 may demultiplex a downstream WDM optical signal (e.g., $\lambda_{L1}, \lambda_{L2}, \ldots \lambda_{Ln}$) from the OLT 210 for transmission of the separate channel wavelengths to the respective ONUs 212-1 to 212-n. Alternatively, the branching point 213 may provide the downstream WDM optical signal to each of the ONUs 212-1 to 212-n and each of the ONUs 212-1 to 212-n separates and processes the assigned optical channel wavelength. The individual optical signals may be encrypted to prevent eavesdropping on optical channels not assigned to a particular ONU. The branching point 213 also combines or multiplexes the upstream optical signals from the respective ONUs 212-1 to 212-n for transmission as an upstream WDM optical signal (e.g., $\lambda_{C1}, \lambda_{C2}, \ldots \lambda_{Cn}$) over the trunk optical path 214 to the OLT 210.

One embodiment of the ONU 212-1 includes a laser 216 for transmitting an optical signal at the assigned upstream channel wavelength ($\lambda_{C1}$) and a photodetector 218, such as a photodiode, for receiving an optical signal at the assigned downstream channel wavelength ($\lambda_{L1}$). The laser 216 may be a parallel cavity tunable laser, consistent with embodiments described herein, configured to be tuned to the assigned channel wavelength, for example, by changing a temperature of the laser 216. This embodiment of the ONU 212-1 may also include a diplexer 217 coupled to the laser 216 and the photodetector 218 and a C+L band filter 219 coupled to the diplexer 217, which allow the L-band channel wavelength ($\lambda_{L1}$) to be received by the ONU 212-1 and the C-band channel wavelength ($\lambda_{C1}$) to be transmitted by the ONU 212-1. The ONU 212-1 may also include a temperature control system for controlling a temperature of the laser 216 and laser driver circuitry for driving the laser 216.

The OLT 210 may be configured to generate multiple optical signals at different channel wavelengths (e.g., $\lambda_{L1}, \lambda_{L2}, \ldots \lambda_{Ln}$) and to combine the optical signals into the downstream WDM optical signal carried on the trunk optical fiber or path 214. Each of the OLT multi-channel optical transceivers 202a, 202b may include a multi-channel transmitter optical subassembly (TOSA) 220 for generating and combining the optical signals at the multiple channel wavelengths. The OLT 210 may also be configured to separate optical signals at different channel wavelengths (e.g., $\lambda_{C1}, \lambda_{C2}, \ldots \lambda_{Cn}$) from an upstream WDM optical signal carried on the trunk path 214 and to receive the separated optical signals. Each of the OLT multi-channel optical transceivers 202a, 202b may thus include a multi-channel receiver optical subassembly (ROSA) 230 for separating and receiving the optical signals at multiple channel wavelengths.

One embodiment of the multi-channel TOSA 220 includes an array of lasers 222, which may be modulated by respective RF data signals (TX_D1 to TX_Dm) to generate the respective optical signals. The lasers 222 may include parallel cavity tunable lasers as described herein. The lasers 222 may be modulated using various modulation techniques including external modulation and direct modulation. An optical multiplexer 224, such as an arrayed waveguide grating (AWG), combines the optical signals at the different respective downstream channel wavelengths (e.g., $\lambda_{L1}, \lambda_{L2}, \ldots \lambda_{Lm}$). The lasers 222 may be tuned to the channel wavelengths by changing a temperature of the lasers 222. The TOSA 220 may also include a temperature control system for controlling temperature of the lasers 222 and the multiplexer 224 to maintain a desired wavelength precision or accuracy.

In the illustrated embodiment, the OLT 210 further includes a multiplexer 204 for multiplexing the multiplexed optical signal from the multi-channel TOSA 220 in the multi-channel transceiver 202a with a multiplexed optical signal from a multi-channel TOSA in the other multi-channel transceiver 202b to produce the downstream aggregate WDM optical signal.

One embodiment of the multi-channel ROSA 230 includes a demultiplexer 232 for separating the respective upstream channel wavelengths (e.g., $\lambda_{C1}, \lambda_{C2}, \ldots \lambda_{Cn}$). An array of photodetectors 234, such as photodiodes, detects the optical signals at the respective separated upstream channel wavelengths and provides the received data signals (RX_D1 to RX_Dm). In the illustrated embodiment, the OLT 210 further includes a demultiplexer 206 for demultiplexing the upstream WDM optical signal into first and second WDM optical signals provided to the respective multi-channel ROSA in each of the transceivers 202a, 202b. The OLT 210 also includes a diplexer 208 between the trunk path 214 and the multiplexer 204 and the demultiplexer 206 such that the trunk path 214 carries both the upstream and the downstream channel wavelengths. The transceivers 202a, 202b may also include other components, such as laser drivers, transimpedance amplifiers (TIAs), and control interfaces, used for transmitting and receiving optical signals.

In one example, each of the multi-channel optical transceivers 202a, 202b may be configured to transmit and receive 16 channels such that the WDM-PON 200 supports 32 downstream L-band channel wavelengths and 32 upstream C-band channel wavelengths. One example of the WDM-PON 200 may operate at 1.25 Gbaud using on-off keying as the modulation scheme. Other data rates and modulation schemes may also be used. Using the parallel cavity tunable lasers described herein, for example, may allow higher data rates of 2.5 G or 10 G.

As mentioned above, the upstream and downstream channel wavelengths may span a range of channel wavelengths on the 100 GHz ITU grid. Each of the transceivers 202a, 202b, for example, may cover 16 channel wavelengths in the L-band for the TOSA and 16 channel wavelengths in the C-band for the ROSA such that the transceivers 202a, 202b together cover 32 channels. Thus, the multiplexer 204 may combine 16 channels from one transceiver 202a with 16 channels from the other transceiver 202b, and the demultiplexer 206 may separate a 32 channel WDM optical signal into two 16 channel WDM optical signals. To facilitate use of the multiplexer 204 and the demultiplexer 206, the range of channel wavelengths may skip channels in the middle of the range. According to one example of a multi-channel optical transceiver used in the WDM-PON 200, the desired wavelength precision or accuracy is ±0.05 nm, and the desired operating temperature is between −5 and 70° C.

Figure 3:
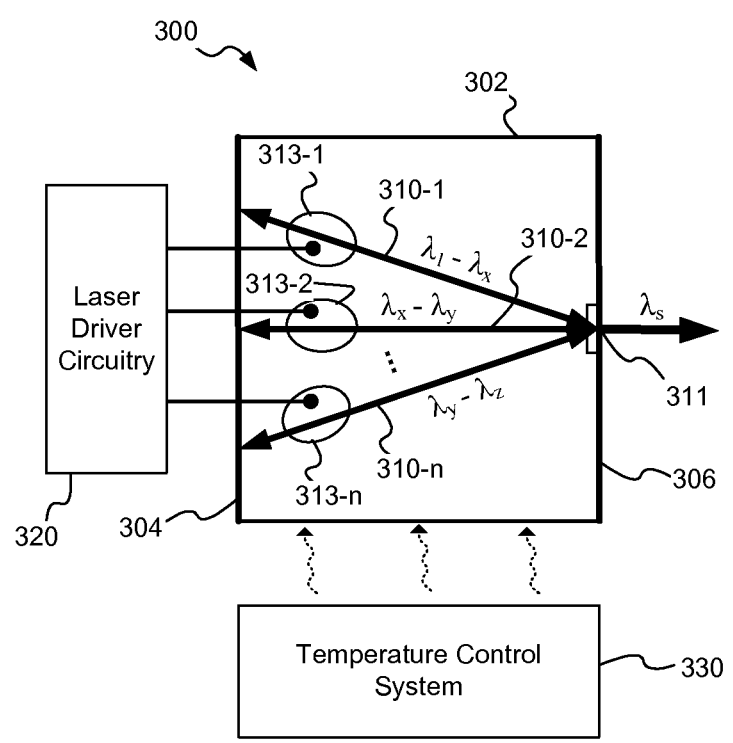
FIG. 3 is a schematic diagram of a parallel cavity tunable laser with a common output, consistent with embodiments of the present disclosure.

Referring to FIG. 3, a parallel cavity tunable laser 300 capable of being used in a WDM system, such as a WDM-PON, is described in greater detail. The parallel cavity tunable laser 300 includes a semiconductor laser body 302 extending between a back facet 304 and a front facet 306. The laser body 302 includes a plurality of parallel, thermally tunable laser cavities 310-1 to 310-n with a common output 311 at the front facet 306. As such, the parallel laser cavities 310-1 to 310-n may be fabricated together on the same chip. As will be described in greater detail below, each of the parallel laser cavities 310-1 to 310-n may be configured to generate laser light within a different respective wavelength range, for example, by using different cavity lengths and/or grating structures.

Although the illustrated embodiment shows the parallel laser cavities 310-1 to 310-n extending from the back facet 304 to the front facet 306, the parallel laser cavities do not necessarily need to extend from the back facet 304. The parallel laser cavities 310-1 to 310-n may have the same or different lengths. Although the illustrated embodiments show three (3) laser sections, a parallel cavity tunable laser may include other numbers of parallel laser cavities.

Each of the parallel laser cavities 310-1 to 310-n may be thermally tuned such that laser light is emitted from the common output 311 at the front facet 306 of the laser body 302 at a selected wavelength $\lambda_s$, such as a selected channel wavelength, within one of the respective wavelength ranges. The laser light emitted from the tunable laser 300 may be predominantly at the selected wavelength $\lambda_s$ and light at wavelengths other than the selected channel may be minimized to improve performance (e.g., reduce noise). The laser light emitted from the tunable laser 300 may also be filtered to remove a substantial portion or all of the wavelengths other than the selected wavelength.

Laser driver circuitry 320 is electrically connected to each of the parallel laser cavities 310-1 to 310-n for driving each of the parallel laser cavities 310-1 to 310-n independently to generate laser light from a selected one of the parallel laser cavities 310-1 to 310-n and within the respective wavelength range. The laser driver circuitry 320 may be electrically connected, for example, using wire bonding to conductive pads or regions 313-1 to 313-n proximate the respective parallel laser cavities 310-1 to 310-n. The laser driver circuitry 320 may include circuitry configured to drive semiconductor lasers by applying a driving or operating current ($I_{op}$) sufficient to induce lasing. In an optical transmitter, for example, the laser driver circuitry 320 directly modulates the respective one of the parallel laser cavities 310-1 to 310-n with an electrical signal, such as an RF signal, to produce a modulated optical signal at a selected channel wavelength.

A temperature control system 330 is thermally coupled to each of the parallel laser cavities 310-1 to 310-n for thermally tuning each of the parallel laser cavities 310-1 to 310-n to a selected wavelength within the respective wavelength range. The parallel laser cavities 310-1 to 310-n may be thermally tuned using any configuration or technique capable of tuning to a selected wavelength in response to temperature changes. The temperature control system 330 may include one or more temperature control devices, such as thermoelectric coolers (TECs) and/or resistive heaters, for changing a temperature of each laser section sufficient to change the wavelength generated within that laser section. The temperature of each of the parallel laser cavities 310-1 to 310-n may be changed using the same temperature control device or using individual temperature control devices thermally coupled to the respective parallel laser cavities 310-1 to 310-n. Although the temperature control system 330 is shown schematically on the side of the tunable laser 300, the temperature control system 330 may include a TEC located below the tunable laser 300. The temperature control system 330 may also include temperature sensors and/or wavelength monitors and control circuitry. The control circuitry may cause the temperature control devices to set the temperature, for example, in response to a monitored temperature at the tunable laser 300 or in response to a monitored wavelength emitted by the tunable laser 300.

As illustrated, for example, the laser cavity 310-1 may be driven and tuned to generate laser light at a channel wavelength within the wavelength range $\lambda_1$-$\lambda_x$, the laser cavity 310-2 may be driven and tuned to generate laser light at a channel wavelength within the wavelength range $\lambda_x$-$\lambda_y$, and the laser cavity 310-n may be driven and tuned to generate laser light at a channel wavelength within the wavelength range $\lambda_y$-$\lambda_z$. Thus, the parallel cavity tunable laser 300 may be used to generate and emit a selected channel wavelength $\lambda_s$ from z channel wavelengths by selectively driving and thermally tuning one of the cavities 310-1 to 310-n. By using the parallel, thermally tunable laser cavities 310-1 to 310-n with different respective wavelength ranges, the tunable laser 300 is capable of being tuned to a wider range of channel wavelengths within a smaller temperature range. Because the laser cavities 310-1 to 310-n are arranged in parallel within the tunable laser 300, the tunable laser 300 may be tuned over this wider range of channel wavelengths without significantly extending the overall cavity length of the tunable laser 300. The parallel laser cavities 310-1 to 310-n may thus have lengths that are capable of being directly modulated at higher data rates (e.g., 2.5 G and 10 G).

In one example with sixteen (16) channels, the multiple section tunable laser 300 may include three (3) parallel laser cavities and each respective wavelength range may cover about 4 nm and may include at least five (5) channel wavelengths. Although the wavelength shift with temperature is generally a function of the material properties, in one example, the wavelength in each of the parallel laser cavities may change by about 0.1 nm/° C. Thus, each parallel laser cavity should be tunable to about 5 or 6 different channel wavelengths in different respective wavelength ranges in the C-band using the same temperature range of about $\Delta 40°$ C.

Figure 4A:
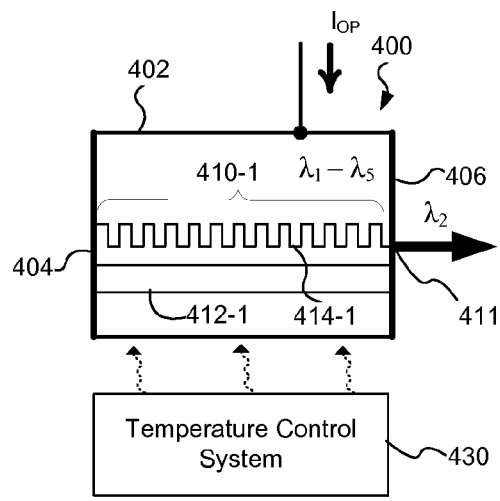
FIGS. 4A-4C are schematic diagrams of gratings in each laser cavity in an embodiment of the parallel cavity tunable laser and illustrating operation of the parallel cavity tunable laser.
Figure 4B:
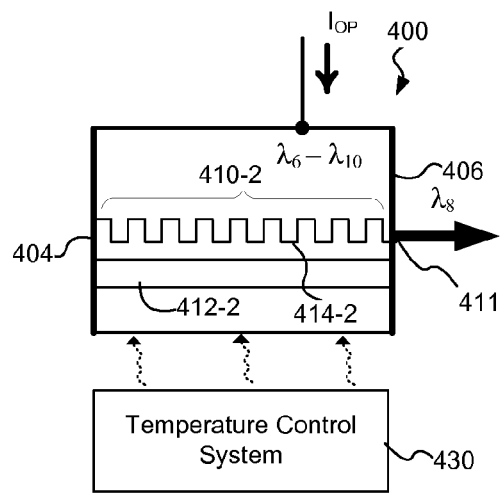
Figure 4C:
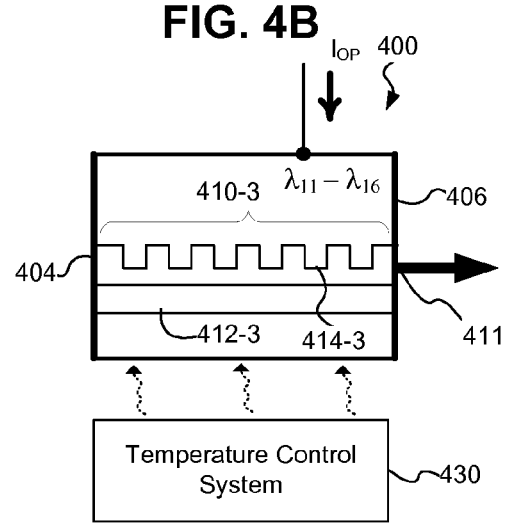

One embodiment of a parallel cavity tunable laser 400, shown in FIGS. 4A-4C, uses different grating structures to generate laser light in different respective wavelengths, for example, similar to a distributed feedback (DFB) laser. The multiple section tunable laser 400 includes a semiconductor laser body 402 with a plurality of parallel, thermally tunable laser cavities 410-1 to 410-3 (shown respectively in FIGS. 4A-4C) including respective grating sections 414-1 to 414-3 along semiconductor active regions 412-1 to 412-3. The semiconductor active regions 412-1 to 412-3 may include a multiple quantum-well active region or other gain media capable of emitting a spectrum of light across a range of wavelengths and capable of amplifying light reflected back into the gain media. The grating sections 414-1 to 414-3 have grating structures (e.g., grating period, index of refraction, and length) that generate light within the respective wavelength ranges. The grating sections 414-1 to 414-3 may include, for example, diffraction or Bragg grating structures known for use in DFB lasers for distributively feeding light back by Bragg reflection at a Bragg wavelength.

As illustrated, each of the grating sections 414-1 to 414-3 may have a different structure (e.g., different grating period) corresponding to the different respective wavelength ranges. In the illustrated example, the first grating section 414-1 in the first laser cavity 410-1 (FIG. 4A) is configured to reflect light at a Bragg wavelength in a wavelength range of $\lambda_1$-$\lambda_5$, the second grating section 414-2 in the second laser cavity 410-2 (FIG. 4B) is configured to reflect light at a Bragg wavelength in a wavelength range of $\lambda_6$-$\lambda_{10}$, and the third grating section 414-3 in the third laser cavity 410-3 (FIG. 4C) is configured to reflect light at a Bragg wavelength in a wavelength range of $\lambda_{11}$-$\lambda_{16}$. Each of the laser cavities 410-1 to 410-3 may be thermally tuned to change the reflected Bragg wavelength within the respective wavelength ranges and select the lasing wavelength.

Where there is sufficient reflectivity in the laser cavities 410-1 to 410-3, the back facet 404 and the front facet 406 may include an anti-reflective (AR) coating, for example, with a reflectivity of less than about 1% reflective. The laser light generated in a selected one of the laser cavities 410-1 to 410-3 may thus be emitted from the front facet 406. In other embodiments, the back facet 404 may include a highly reflective (HR) coating having a reflectivity of at least about 80% to reflect most of the laser light to the front facet 406.

In either case, the back facet 404 may allow a portion of the laser light to pass through the back facet 404 for monitoring.

FIGS. 4A-4C also illustrate operation of an embodiment of the parallel cavity laser 400. To select a channel wavelength $\lambda_2$ in the first wavelength range $\lambda_1$-$\lambda_5$ (FIG. 4A) in this example, the driving current ($I_{OP}$) is applied to the first laser cavity 410-1 with negligible or no driving current applied to the other laser cavities 410-2, 410-3. As the first laser cavity 410-1 is driven, the temperature of the first laser cavity 410-1 is set using the temperature control system 430 such that the first laser cavity 410-1 is thermally tuned to the selected channel wavelength $\lambda_2$. The light generated in the first laser section 410-1 is reflected by the first grating section 414-1 and within the first laser cavity 410-1 until lasing occurs. The laser light at the selected channel wavelength $\lambda_2$ then passes out of the first laser cavity 410-1 and is emitted from the common output 411 at the front facet 406. To select another channel wavelength in the first wavelength range $\lambda_1$-$\lambda_5$, the parallel cavity tunable laser 400 may be further tuned by changing the temperature.

To select a channel wavelength $\lambda_8$ in the second wavelength range $\lambda_6$-$\lambda_{10}$ (FIG. 4B), the driving current ($I_{OP}$) is applied to the second laser cavity 410-2 with negligible or no driving current applied to the other laser cavities 410-1, 410-3. As the second laser cavity 410-2 is driven, the temperature of the second laser cavity 410-2 is set by the temperature control system 430 such that the second laser cavity 410-2 is thermally tuned to the selected channel wavelength $\lambda_8$. The light generated in the second laser cavity 410-2 is reflected by the second grating section 414-2 and within the second laser cavity 410-2 until lasing occurs. The laser light at the selected channel wavelength $\lambda_8$ then passes out of the second laser cavity 410-2 and is emitted from the common output 411 at the front facet 406. To select another channel wavelength in the second wavelength range $\lambda_6$-$\lambda_{10}$, the tunable laser 400 may be further tuned by changing the temperature. Channel wavelengths in the third wavelength range $\lambda_{11}$-$\lambda_{16}$ (FIG. 4C) may also be selected by similarly driving and thermally tuning the third laser cavity 410-3.

Although the embodiment of the parallel cavity tunable laser 400 shown in FIG. 4 may advantageously extend the wavelength tuning range without extending the temperature range, the grating sections 414-1 to 414-3, similar to gratings in DFB type lasers, may produce degenerate modes. The existence of these degenerate modes may result in multi-mode operation, unpredictable modes, or mode hopping, sometimes referred to as mode degeneracy.

Figure 5:
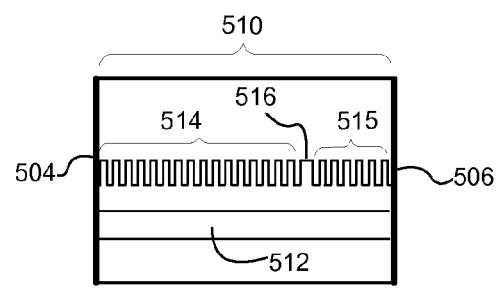
FIG. 5 is a schematic diagram of an embodiment of a parallel laser cavity including a grating and a phase shift.
Figure 6:
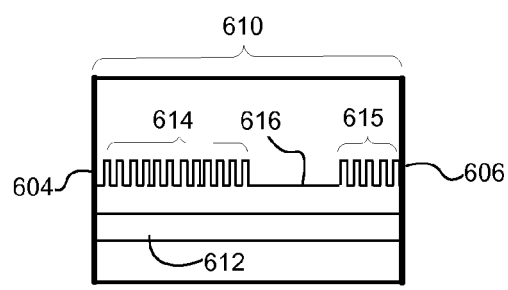
FIG. 6 is a schematic diagram of an embodiment of a parallel laser cavity including a grating and a phase shift.

Other embodiments of laser cavities 510, 610, shown in FIGS. 5 and 6, use different grating structures that provide a phase shift of the laser light to suppress mode degeneracy and provide a single mode operation at a selected wavelength. In one embodiment, the phase shift is approximately a $\pi/2$ optical phase shift of the laser light at the Bragg wavelength ($\lambda_B$) of the grating section, which is also referred to as a quarter-wavelength or $\lambda/4$ phase shift because a $\pi/2$ phase shift at the Bragg wavelength $\lambda_B$ is equivalent to adding a section of $\Lambda/2=\lambda_B/(4n_e)$ into the grating structure where $\Lambda$ is the period of the grating and $n_e$ is the effective refractive index of the waveguide having the grating. As used herein, a "$\lambda/4$ phase shift" refers to an optical shift of the laser light in phase by about $\pi/2$ or by an equivalent amount that suppresses mode degeneracy sufficiently to provide single-mode operation at or near the Bragg wavelength. The term "$\lambda/4$ phase shift" does not necessarily require a phase shift that exactly corresponds to $\lambda/4$ or $\pi/2$, single-mode operation at exactly the Bragg wavelength, or a change in the phase of the grating itself. The term "$\lambda/4$ phase shift" also does not require a single $\lambda/4$ phase shift but may include multiple smaller, distributed phase shifts (e.g., two $\lambda/8$ phase shifts), which are equivalent to a $\lambda/4$ phase shift. Although example embodiments refer to a $\lambda/4$ phase shift, other embodiments of a parallel cavity tunable laser may provide other phase shifts capable of providing single mode operation.

As shown in FIG. 5, for example, a laser cavity 510 may provide a $\lambda/4$ phase shift by including a $\pi/2$ phase shift section in the grating. The laser cavity 510 includes a back grating section 514 and a front grating section 515 along a semiconductor active region 512 between a back facet 504 and a front facet 506. A phase shift section 516 between the back grating section 514 and the front grating section 515 provides a $\pi/2$ grating shift by flipping the grating 180° at one point (i.e., adding a section of $\Lambda/2$), which introduces the $\lambda/4$ phase shift in the laser light reflected between the grating sections.

In addition to flipping the grating by 180° at the phase shift section 516, the back grating section 514 and the front grating section 515 may also be separated by blank sections without gratings. Separating the back grating section 514 from the front grating section 515 with the phase shift section 516 may create a DBR mirror like function. In the illustrated embodiment, the back grating section 514 is longer than the front grating section 515, thereby providing higher reflectivity at the back of each of the laser sections. One skilled in the art may select the length of the back grating section 514 relative to the front grating section 515 as a tradeoff between efficiency and mode stability. In this embodiment, both the back facet 504 and the front facet 506 may have AR coatings.

Although the embodiment of the laser cavity 510 shown in FIG. 5 may provide single-mode operation, fabrication of the phase shift within the grating itself requires two separate gratings in each section and may present manufacturing difficulties. As shown in FIG. 6, another embodiment of a laser cavity 610 provides a $\lambda/4$ phase shift in the laser light by providing a section where there is no grating (i.e., a gratingless section) but without any change in the phase of the grating structure. The laser cavity 600 includes a back grating section 614, a gratingless section 616, and a front grating section 615 along a semiconductor active region 612 between a back facet 604 and a front facet 606.

The gratings of the back grating section 614 and the front grating section 615 may be "in phase" with each other and the gratingless section 616 covers a length between the back and front grating sections, which is missing grating periods that otherwise would be in phase with the grating period of the back and front grating section. Thus, the gratingless section 616 has a different effective index of refraction than the grating sections and effectively provides a distributed phase shift section because it extends over a substantial number of missing grating periods between the back grating section 614 and the front grating section 615. The gratingless section 616 may thus provide the $\lambda/4$ phase shift without requiring a change in the actual grating phase between the back grating section 614 and the front grating section 616 and without requiring the back and front grating sections to be formed separately with different grating periods.

The gratingless section 616 may be formed by first forming a continuous, uniform grating having the desired grating period and then removing a portion of the grating (e.g., by chemically etching) between the back grating section 614 and the front grating section 615. Examples of gratingless structures providing a $\lambda/4$ phase shift and methods of forming such gratingless structures are described in greater detail in U.S. Pat. Nos. 6,608,855 and 6,638,773, which are incorporated herein by reference.

In this embodiment, the back grating section 614 is longer than the front grating section 615 and the gratingless section 616 is shorter than the back grating section 614 and longer than the front grating section 615. The back and front grating sections thus act like DBR mirrors (i.e., back and exit mirrors). In other words, the longer back grating section 614 provides sufficient reflectivity to act as a back mirror and the shorter front grating section 615 provides sufficient reflectivity to act as an exit mirror that cause lasing while also allowing the laser light to exit. Because the back grating section provides sufficient reflectivity, the back facet 604 is not required to be coated with an HR coating. In this embodiment, both the back facet 604 and the front facet 606 may be coated with AR coatings.

In one example, the back grating section 614 has a length of about 150 µm, the front grating section 615 has a length of about 100 µm, and the gratingless section 616 has a length of about 50 µm. Where each grating is about 0.24 µm, for example, the back grating section may have 625 gratings and the front grating section may have 417 gratings. Other dimensions and configurations are also possible and within the scope of the present disclosure.

Figure 7:
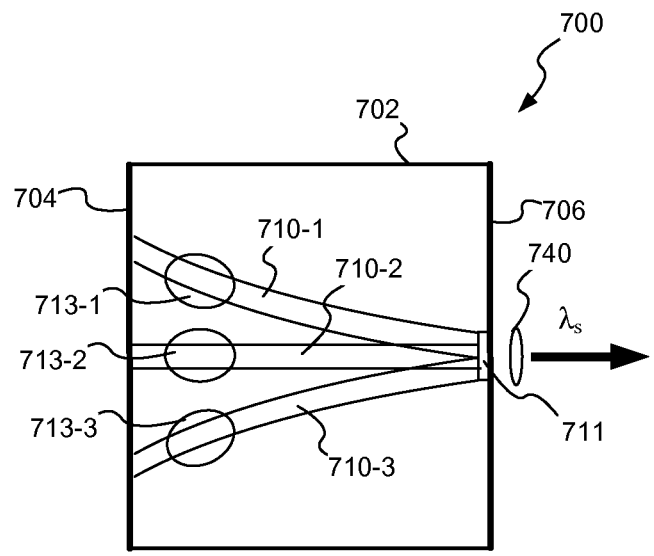
FIG. 7 is a top view of an embodiment of a parallel cavity tunable laser illustrating an example configuration of the parallel laser cavities with the common output.
Figure 8:
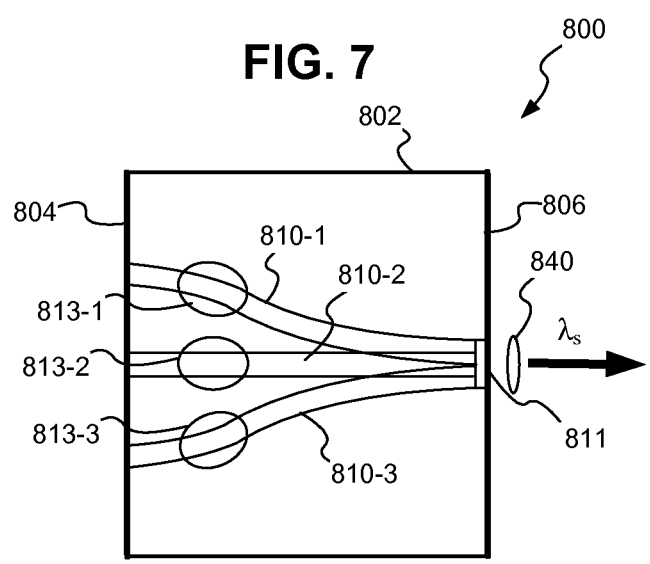
FIG. 8 is a top view of another embodiment of a parallel cavity tunable laser illustrating another example configuration of the parallel laser cavities with the common output.

FIGS. 7 and 8 illustrate different configurations for parallel laser cavities in parallel cavity tunable lasers 700, 800, consistent with embodiments of the present disclosure. The parallel cavity tunable laser 700 shown in FIG. 7 includes a generally straight laser cavity 710-2 at a center with curved laser cavities 710-1, 710-3 on each side within a semiconductor laser body 702. The curved laser cavities 710-1, 710-3 converge with the straight laser cavity 710-2 at a common output 711 at a front facet 706 of the semiconductor laser body 702. The curved laser cavities 710-2, 710-3 curve away from the straight laser cavity 710-2 toward a back facet 704 of the semiconductor laser body 702. The curved laser cavities 710-2, 710-3 curve and separate sufficiently to form separate and distinct laser cavities capable of being driven independently by a driving current.

Conductive pads 713-1 to 713-3 are deposited on the semiconductor laser body 702 proximate the respective laser cavities 710-1 to 710-3 such that the driving current passes through the semiconductor laser body 702 to activate the respective laser cavities 710-1 to 710-3 independently. A lens 740 may be used to optically couple the light from the common output 711 to an optical fiber or waveguide (not shown).

The parallel cavity tunable laser 800 shown in FIG. 8 also includes a generally straight laser cavity 810-2 at a center with curved laser cavities 810-1, 810-3 on each side within a semiconductor laser body 802. In this embodiment, the curved laser cavities 810-1, 810-3 converge with the straight laser cavity 810-2 at a common output 811 at a front facet 806 of the semiconductor laser body 802 and curve away from the straight laser cavity 810-2 toward a back facet 804 of the semiconductor laser body 802. Instead of being flared at the ends, however, the curved laser cavities 810-1, 810-3 straighten proximate the back facet 804 of the semiconductor laser body 802 to facilitate reflection of light in the curved laser cavities 810-1, 810-3 at the back facet 804.

Conductive pads 813-1 to 813-3 are deposited on the semiconductor laser body 802 proximate the respective laser cavities 810-1 to 810-3 such that the driving current passes through the semiconductor laser body 802 to activate the respective laser cavities 810-1 to 810-3 independently. A lens 840 may be used to optically couple the light from the common output 811 to an optical fiber or waveguide (not shown).

Other shapes and configurations for the parallel laser cavities are also contemplated and within the scope of the present disclosure. Although three parallel laser cavities are shown, a parallel cavity tunable laser may include other numbers of parallel laser cavities.

Accordingly, parallel cavity tunable lasers including parallel cavities with a common output, consistent with embodiments described herein, may provide relatively inexpensive lasers capable of being tuned within a relative wide range for WDM applications and cable of being modulated at higher frequencies to provide higher data rates.

Consistent with an embodiment, a tunable laser includes a semiconductor laser body extending between a front facet and a back facet. The laser body includes a plurality of parallel laser cavities each configured to be driven independently to generate laser light at a wavelength within a different respective wavelength range. Each of the plurality of parallel laser cavities is tunable in response to temperature changes to generate a selected wavelength within the respective wavelength range and wherein the laser light generated from each selected one of the parallel laser cavities is emitted from a common output at the front facet.

Consistent with another embodiment, an optical networking unit includes a photodetector for receiving an optical signal at a received channel wavelength, wherein the received channel wavelength is in one of the L-band or the C-band, and a tunable laser for transmitting an optical signal at a transmitted channel wavelength in the other of the L-band or the C-band. The tunable laser includes a semiconductor laser body extending between a front facet and a back facet, and the laser body includes a plurality of parallel laser cavities each configured to be driven independently to generate laser light at a wavelength within a different respective wavelength range. Each of the plurality of parallel laser cavities is tunable in response to temperature changes to generate a selected wavelength within the respective wavelength range and wherein the laser light generated from each selected one of the parallel laser cavities is emitted from a common output at the front facet.

Consistent with a further embodiment, a wavelength division multiplexed (WDM) system includes a plurality of terminals associated with different respective channel wavelengths and configured to transmit optical signals on the different respective channel wavelengths. At least one of the plurality of terminals includes at least a tunable laser configured to be tuned to a respective one of the channel wavelengths. The tunable laser includes a semiconductor laser body extending between a front facet and a back facet, and the laser body includes a plurality of parallel laser cavities each configured to be driven independently to generate laser light at a wavelength within a different respective wavelength range. Each of the plurality of parallel laser cavities is tunable in response to temperature changes to generate a selected wavelength within the respective wavelength range and wherein the laser light generated from each selected one of the parallel laser cavities is emitted from a common output at the front facet.

Consistent with yet another embodiment, a method includes: providing a tunable laser comprising a semiconductor laser body extending between a front facet and a back facet, the laser body including a plurality of parallel laser cavities configured to generate laser light within different respective wavelength ranges, wherein the laser light generated from each selected one of the parallel laser cavities is emitted from a common output at the front facet; driving a selected one of the parallel laser cavities independently of others of the parallel laser cavities to generate laser light from the selected one of the parallel laser cavities within a respective wavelength range; tuning the tunable laser such that the laser light is generated in the selected one of the parallel laser cavities at a selected wavelength within the respective wavelength range; and emitting the laser light at the selected wavelength from the common output at the front facet of the tunable laser.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A tunable laser comprising:
a semiconductor laser body extending between a front facet and a back facet, the laser body including a plurality of parallel laser cavities each configured to be driven independently to generate laser light at a wavelength within a different respective wavelength range, wherein each of the plurality of parallel laser cavities is tunable in response to temperature changes to generate a selected wavelength within the respective wavelength range and wherein each of the plurality of parallel laser cavities converges at a common output at the front facet such that the laser light generated from each selected one of the parallel laser cavities is emitted from the common output at the front facet.

2. The tunable laser of claim 1, wherein the plurality of parallel laser cavities include three laser cavities.

3. The tunable laser of claim 1, wherein each said different respective wavelength range includes at least five channel wavelengths.

4. The tunable laser of claim 3, wherein each of the parallel laser cavities is tunable to one of the five channel wavelengths using the same temperature range.

5. The tunable laser of claim 1, wherein each said different respective wavelength range includes channel wavelengths in the C-band.

6. The tunable laser of claim 1, wherein each of the parallel laser cavities comprises:
a semiconductor active region for amplifying, by stimulated emission, light at a wavelength in the respective wavelength range; and
a grating section along the active region, the grating section being configured to produce the wavelength in the respective wavelength range.

7. The tunable laser of claim 6, wherein the front facet and the back facet include anti-reflective (AR) coatings.

8. The tunable laser of claim 6, wherein the grating section provides a phase shift of the laser light between a front and a back of the grating section, and wherein the phase shift is configured to provide single mode operation at the selected wavelength.

9. The tunable laser of claim 8, wherein the phase shift provides a λ/4 phase shift of the laser light.

10. The tunable laser of claim 8, wherein the grating section includes a phase shift section that flips the grating by 180 degrees between the front and back of the grating section.

11. The tunable laser of claim 8, wherein the grating section includes a blank section between the front and the back of the grating section, and wherein the blank section provides the phase shift.

12. The tunable laser of claim 8, wherein the grating section includes a back grating section having a first reflectance and a front grating section having a second reflectance greater than the first reflectance such that lasing occurs between the back grating section and the front grating section and laser light passes through the front grating section.

13. The tunable laser of claim 1, wherein each of the parallel laser cavities comprises:
a semiconductor active region for amplifying, by stimulated emission, light at a wavelength in the respective wavelength range;
a back grating section having a first reflectance; and
a front grating section having a second reflectance greater than the first reflectance such that lasing occurs between the back grating section and the front grating section and laser light passes through the front grating section, and wherein the back and front grating sections are configured to emit a wavelength within the respective wavelength range.

14. The tunable laser of claim 13, wherein the back grating section is longer than the front grating section.

15. The tunable laser of claim 13, further comprising a phase shift section between the back grating section and the front grating section, and wherein the phase shift section is configured to provide a phase shift of the laser light.

16. The tunable laser of claim 15, wherein the phase shift section provides approximately a λ/4 phase shift of the laser light.

17. The tunable laser of claim 15, wherein the phase shift section flips the grating by 180 degrees between the back grating section and the front grating section.

18. The tunable laser of claim 15, wherein the phase shift section is a blank grating section without a grating.

19. An optical networking unit comprising:
a photodetector for receiving an optical signal at a received channel wavelength, wherein the received channel wavelength is in one of the L-band or the C-band; and
a tunable laser for transmitting an optical signal at a transmitted channel wavelength, wherein the transmitted channel wavelength is in the other of the L-band or the C-band, the tunable laser comprising a semiconductor laser body extending between a front facet and a back facet, the laser body including a plurality of parallel laser cavities each configured to be driven independently to generate laser light at a wavelength within a different respective wavelength range, wherein each of the plurality of parallel laser cavities is tunable in response to temperature changes to generate a selected wavelength within the respective wavelength range and wherein each of the plurality of parallel laser cavities converges at a common output at the front facet such that the laser light generated from each selected one of the parallel laser cavities is emitted from the common output at the front facet.

20. A wavelength division multiplexed (WDM) system comprising:
a plurality of terminals associated with different respective channel wavelengths and configured to transmit optical signals on the different respective channel wavelengths, at least one of the plurality of terminals including at least a tunable laser configured to be tuned to a respective one of the channel wavelengths, the tunable laser comprising:
a semiconductor laser body extending between a front facet and a back facet, the laser body including a plurality of parallel laser cavities each configured to be driven independently to generate laser light at a wavelength within a different respective wavelength range, wherein each of the plurality of parallel laser cavities is tunable in response to temperature changes to generate a selected wavelength within the respective wavelength range and wherein each of the plurality of parallel laser cavities converges at a common output at the front facet such that the laser light generated from each selected one of the parallel laser cavities is emitted from the common output at the front facet.

21. The WDM system of claim 20 wherein the plurality of terminals include optical networking terminals (ONTs) in a WDM passive optical network (PON).

22. The WDM system of claim 21 further comprising:
at least one optical line terminal (OLT) configured to receive aggregate WDM optical signals including the channel wavelengths;
at least one branching point coupled between the OLT and the plurality of ONTs, the branching point being configured to combine the optical signals at the channel wavelengths; and
a trunk optical path coupling the OLT and the branching point.

23. A method comprising:
providing a tunable laser comprising a semiconductor laser body extending between a front facet and a back facet, the laser body including a plurality of parallel laser cavities configured to generate laser light within different respective wavelength ranges, wherein each of the plurality of parallel laser cavities converges at a common output at the front facet such that the laser light generated from each selected one of the parallel laser cavities is emitted from the common output at the front facet;
driving a selected one of the parallel laser cavities independently of others of the parallel laser cavities to generate laser light from the selected one of the parallel laser cavities within a respective wavelength range;
tuning the tunable laser such that the laser light is generated in the selected one of the parallel laser cavities at a selected wavelength within the respective wavelength range; and
emitting the laser light at the selected wavelength from the common output at the front facet of the tunable laser.

24. The method of claim 23 wherein the tunable laser is tuned by changing a temperature of the laser.

25. The method of claim 23 wherein each of the parallel laser cavities is configured to generate laser light within a respective wavelength range including at least five channel wavelengths in the C-band.

* * * * *